United States Patent
Seuring et al.

(10) Patent No.: US 9,885,752 B2
(45) Date of Patent: Feb. 6, 2018

(54) TEST APPARATUS FOR GENERATING REFERENCE SCAN CHAIN TEST DATA AND TEST SYSTEM

(75) Inventors: Markus Seuring, Stuttgart (DE); Michael Braun, Stuttgart (DE)

(73) Assignee: ADVANTEST CORPORATION, Tokyo (JP)

(*) Notice: Subject to any disclaimer, the term of this patent is extended or adjusted under 35 U.S.C. 154(b) by 564 days.

(21) Appl. No.: 13/816,725

(22) PCT Filed: Aug. 12, 2010

(86) PCT No.: PCT/EP2010/061772
§ 371 (c)(1),
(2), (4) Date: Apr. 27, 2015

(87) PCT Pub. No.: WO2012/019649
PCT Pub. Date: Feb. 16, 2012

(65) Prior Publication Data
US 2016/0356847 A1    Dec. 8, 2016

(51) Int. Cl.
*G01R 31/3177* (2006.01)
*G01R 31/3185* (2006.01)
*G01R 31/317* (2006.01)

(52) U.S. Cl.
CPC ... *G01R 31/3177* (2013.01); *G01R 31/31703* (2013.01); *G01R 31/31704* (2013.01); *G01R 31/318547* (2013.01); *G01R 31/318561* (2013.01); *G01R 31/318566* (2013.01); *G01R 31/318569* (2013.01)

(58) Field of Classification Search
CPC ..................................................... G01R 31/31
USPC ................................ 714/727, 724, 730, 734
See application file for complete search history.

(56) References Cited

U.S. PATENT DOCUMENTS

| | | |
|---|---|---|
| 3,678,503 A | 7/1972 | Sollman |
| 4,568,881 A | 2/1986 | Kostrov |
| 4,598,283 A | 7/1986 | Tung et al. |
| 4,687,988 A | 8/1987 | Eichelberger et al. |
| 4,700,347 A | 10/1987 | Rettberg et al. |

(Continued)

FOREIGN PATENT DOCUMENTS

WO    2007059411    5/2007

OTHER PUBLICATIONS

Kazamaki, T., "Milestones of New-Generation ATE", IEEE Design & Test of Computers, 2 (5), pp. 83-89, Oct. 1985.

(Continued)

*Primary Examiner* — Fritz Alphonse

(57) ABSTRACT

A test apparatus for generating reference scan chain test data comprises a test pattern generator and an output data modifier. The test pattern generator modifies a scan chain test input bit sequence by replacing a predefined number of start bits of the scan chain test input bit sequence by a predefined start bit sequence. Further, the test pattern generator provides the modified scan chain test input bit sequence to a device under test. The output data modifier modifies a scan chain test output bit sequence received from the device under test and caused by the modified scan chain test input bit sequence. The scan chain test output bit sequence is modified by replacing a predefined number of end bits of the scan chain test output bit sequence by a predefined end bit sequence to obtain the reference scan chain test data.

21 Claims, 11 Drawing Sheets

(56) References Cited

U.S. PATENT DOCUMENTS

| | | |
|---|---|---|
| 5,247,161 A | 9/1993 | Actis et al. |
| 5,774,477 A | 6/1998 | Ke |
| 5,905,769 A | 5/1999 | Lee et al. |
| 6,061,818 A | 5/2000 | Touba et al. |
| 6,122,335 A | 9/2000 | Colella et al. |
| 6,501,288 B1 * | 12/2002 | Wilsher ............... G01R 31/311 324/515 |
| 6,801,003 B2 | 10/2004 | Schanberger et al. |
| 7,113,560 B1 | 9/2006 | Huang et al. |
| 7,116,052 B2 | 10/2006 | Ito et al. |
| 7,248,982 B1 | 7/2007 | Draving et al. |
| 7,568,139 B2 | 7/2009 | Dokken et al. |
| 7,659,673 B2 | 2/2010 | Lys |
| 8,067,896 B2 | 11/2011 | Shteynberg et al. |
| 8,886,987 B2 | 11/2014 | Rivoir |
| 9,164,726 B2 | 10/2015 | Rivoir et al. |
| 9,341,673 B2 | 5/2016 | Rivoir |
| 2001/0018751 A1 | 8/2001 | Gresham |
| 2002/0047624 A1 | 4/2002 | Stam et al. |
| 2003/0061564 A1 | 3/2003 | Maddux |
| 2004/0022196 A1 | 2/2004 | Rivoir |
| 2005/0015213 A1 * | 1/2005 | Somervill ........... G06F 11/2236 702/117 |
| 2005/0265440 A1 | 12/2005 | Sohn |
| 2006/0047450 A1 | 3/2006 | Tabatabaei et al. |
| 2007/0267978 A1 | 11/2007 | Shteynberg et al. |
| 2008/0034265 A1 | 2/2008 | Kang |
| 2008/0068355 A1 | 3/2008 | Chen et al. |
| 2008/0141085 A1 | 6/2008 | Dokken et al. |
| 2009/0281751 A1 | 11/2009 | Ishida et al. |

OTHER PUBLICATIONS

Rivoir, J., "Fully-Digital Time-To-Digital Coverter for ATE with Autonomous Calibration", IEEE International Test Conference, 2006, paper 6.3., 10 pages.

\* cited by examiner

TEST APPARATUS FOR GENERATING REFERENCE SCAN CHAIN TEST DATA AND TEST SYSTEM

CROSS REFERENCE

The present disclosure claims the benefit of PCT International Application No. PCT/EP2010/061772 filed on Aug. 12, 2010, which is incorporated by reference herein.

TECHNICAL FIELD

Embodiments according to the disclosure relate to the field of integrated circuit testing, and particularly to the field of scan testing of integrated circuits.

BACKGROUND OF THE INVENTION

For test of digital devices, in most cases digital random logic is tested via scan test or Logic Built-in Self Test (LBiST). Both test categories rely on scan chains that allow to shift in test patterns and shift out test results. If shifting through scan chains is blocked by a defect, scan test and LBiST is disturbed and as an outcome of that test, coverage is often considerably reduced. A fast blocked chain analysis is needed that identifies two successive scan cells with the blocking defect in between. Then further fault analysis can be used to find the root cause for the defect and to solve the problem and improve yield.

Additional hardware on the device under test (DUT) that is added during the design process is considered as too costly since such techniques typically require a considerable amount of die area.

It is inherent in the problem of blocked scan chains that without additional hardware the fault location cannot be identified correctly and unambiguously in some cases.

There exist software solutions that perform a blocked chain analysis, but usually require a valid simulation model of the DUT that has to be configured correctly for analysis. Furthermore, a considerable computing power is required to simulate the behavior of a modern design, so it might take minutes, hours or even days. In order to handle ambiguous results, some software solutions provide a confidence level for their results.

For blocked chain analysis Inovys has filed a patent (U.S. Pat. No. 7,568,139) that describes how to implement on a test apparatus a well known process to analyze scan chains that are blocked by permanent defects. However, this solution is not able to handle ambiguous results, in such a case it can report an incorrect faulty site.

SUMMARY OF THE INVENTION

Therefore, it is the object of the present invention to provide concept mechanism allowing to reduce the test time, the hardware efforts and/or to improve the failure localization accuracy in digital device testing.

Embodiments according to the invention relate to digital device testing, and particularly to a test apparatus and method for generating reference scan chain test data, a test system and a method for determining an information of a failure position and a failure type of a faulty scan chain.

According to one embodiment of the present disclosure, a test apparatus for generating reference scan chain test data comprises a test pattern generator and an output data modifier. The test pattern generator is configured to modify a scan chain test input bit sequence by replacing a predefined number of start bits of the scan chain test input bit sequence by a predefined start bit sequence. Further, the test pattern generator is configured to provide the modified scan chain test input bit sequence to a device under test. The output data modifier is configured to modify a scan chain test output bit sequence received from the device under test and caused by the modified scan chain test input bit sequence. The scan chain test output bit sequence is modified by replacing a predefined number of end bits of the scan chain test output bit sequence by a predefined end bit sequence to obtain the reference scan chain test data.

Embodiments according to the present invention are based on the central idea that a behavior of a device under test comprising a faulty scan chain is simulated by providing modified test patterns to a faultless device under test. For this, the test apparatus replaces one or more start bits of the scan chain test input bit sequence and at least one end bit of the scan chain test output bit sequence by predefined bit sequences. In this way, the output of a permanent or transient blocked scan chain can be reproduced by a faultless device. This reference scan chain test data can be compared with an output of a faulty device to obtain information about the failure position and a failure type (e.g. stuck-at-0 or stuck-at-1) of the faulty device.

In this way, no additional hardware may be necessary on the device under test and in comparison to software simulation solutions, amount of test logging data is reduced by just reporting the result of the comparison, the test time can be significantly reduced, it is easier to distinguish systematic from random faults and time to physical failure analysis is shortened, for example.

Some embodiments according to the invention relate to a test system comprising a test apparatus determining a plurality of reference scan chain test data for a plurality of different supposed failure positions, different failure types and/or different scan chain test input bit sequences. Further, the test system comprises an evaluation unit. The obtained plurality scan chain test data may be compared to an output of a faulty device to obtain an information of a failure position and a failure type of the faulty scan chain of the faulty device by the evaluation unit.

BRIEF DESCRIPTION OF THE DRAWINGS

Embodiments according to the invention will be detailed subsequently referring to the appended drawings, in which.

In the following, the same reference numerals are partly used for objects and functional units having the same or similar functional properties and the description thereof with regard to a figure shall apply also to other figures in order to reduce redundancy in the description of the embodiments.

DETAILED DESCRIPTION

Figure 1:
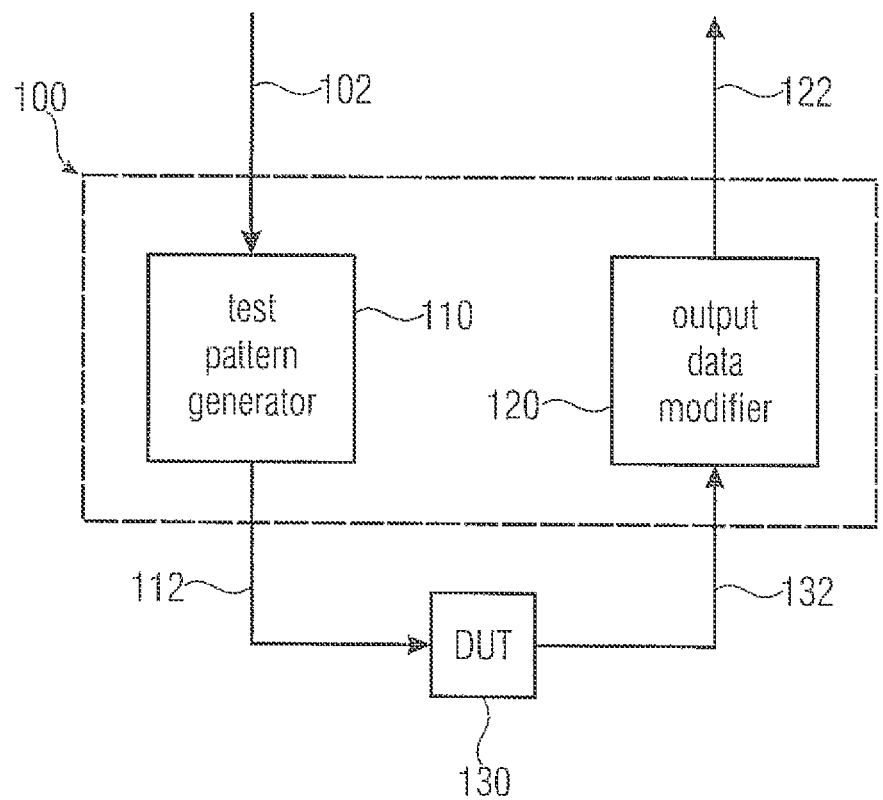
FIG. 1 is a block diagram of an exemplary test apparatus for generating reference scan chain test data.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

FIG. 1 shows a block diagram of an exemplary test apparatus 100 for generating reference scan chain test data 122 according to an embodiment of the invention. The test apparatus 100 comprises a test pattern generator 110 and an output data modifier 120. The test apparatus 100 can be connected to a device under test 130, so that the test pattern generator 110 can provide test data to the device under test 130 and the device under test 130 can provide output test data to the output data modifier 120. The device under test 130 is not part of the test apparatus 100. The test pattern generator 110 modifies a scan chain test input bit sequence 102 by replacing a predefined number of start bits of the scan chain test input bit sequence 102 with a predefined start bit sequence. Further, the test pattern generator 110 provides the modified scan chain test input bit sequence 112 to the device under test 130. The output data modifier 120 modifies a scan chain test output bit sequence 132 received from the device under test 130 caused by the modified scan chain test input bit sequence 112. The scan chain test output bit sequence 132 is modified by replacing a predefined number of end bits of the scan chain test output bit sequence 132 with a predefined end bit sequence to obtain the reference scan chain test data 122.

By modifying the scan chain test input bit sequence 102 and the scan chain test output bit sequence 132, it may be possible to reproduce the behavior of a device comprising a faulty scan chain by a faultless device (good device). In other words, the scan chain of the device under test 130 outputting the scan chain test output bit sequence 132 caused by the modified scan chain test input bit sequence 112 may be faultless. In this way, reference scan chain test data 122 for an assessment of scan chain output data of a faulty device can be generated very fast (e.g. in comparison to failure analysis using conventional software simulations). Further, additional hardware may not be needed on the device under test 130 (DUT).

The scan chain test input bit sequence 102 and the scan chain test output bit sequence 132 may comprise one bit for each scan cell (e.g. flip-flop) of the scan chain of the DUT 130 the reference scan chain test data 122 is determined for. Therefore, the predefined number of start bits and the predefined number of end bits may vary between 0 and the number of bits of the scan chain test input bit sequence 102 or the scan chain test output bit sequence 132.

The test apparatus 100 may determine reference scan chain test data 122 for failures at different positions within the scan chain to be tested or different failure types. In this case, the number of start bits and the number of end bits may depend on a supposed position of a failure within the scan chain, the reference scan chain test data 122 is generated for. In other words, for different supposed failure positions, the number of start bits and the number of end bits may be different. For example, the number of start bits (#sb) plus the number of end bits (#eb) may be equal to the number of bits of the scan chain test input bit sequence 102 (#ibs=#sb+#eb) and equal to the number of bits of the scan chain test output data 132 (#obs=#sb+#eb). In other words, the sum of the number of start bits and the number of end bits may be equal to the number of scan cells of the tested scan chain.

The predefined start bit sequence and the predefined end bit sequence may depend on a supposed failure type the reference end chain test data 122 is generated for. A failure type may be for example a permanent or a transient stuck-at-0 or stuck-at-1 failure. The predefined start bit sequence and the predefined end bit sequence may comprise only logic 0's or only logic 1's. This may depend on the supposed failure type and/or the number of inverters (odd or even number) within the scan chain to be tested. For example, the predefined start bit sequence and the predefined end bit sequence may comprise only logic 0+s for a stuck-at-0 failure and an even number of inverters within the scan chain to be tested or the predefined start bit sequence may comprise only logic 1's and the predefined end bit sequence may comprise only logic 0's for a stuck-at-0 failure and an odd number of inverters within the scan chain to be tested.

In the following, FIGS. 2 to 6 illustrate the present disclosure for a scan chain 200 comprising 10 scan flip-flops 210 (scan cells) considering different failure types and different numbers of inverters.

The presence of a defect causing a blocked scan chain can be reproduced on a specific test apparatus using a DUT that is fault free, meaning no faulty scan chains, where the test apparatus is configured to provide new additional functionality that allows to modify input patterns (scan chain test input bit sequences) and output patterns (scan chain test output bit sequences) accordingly.

Figure 2:
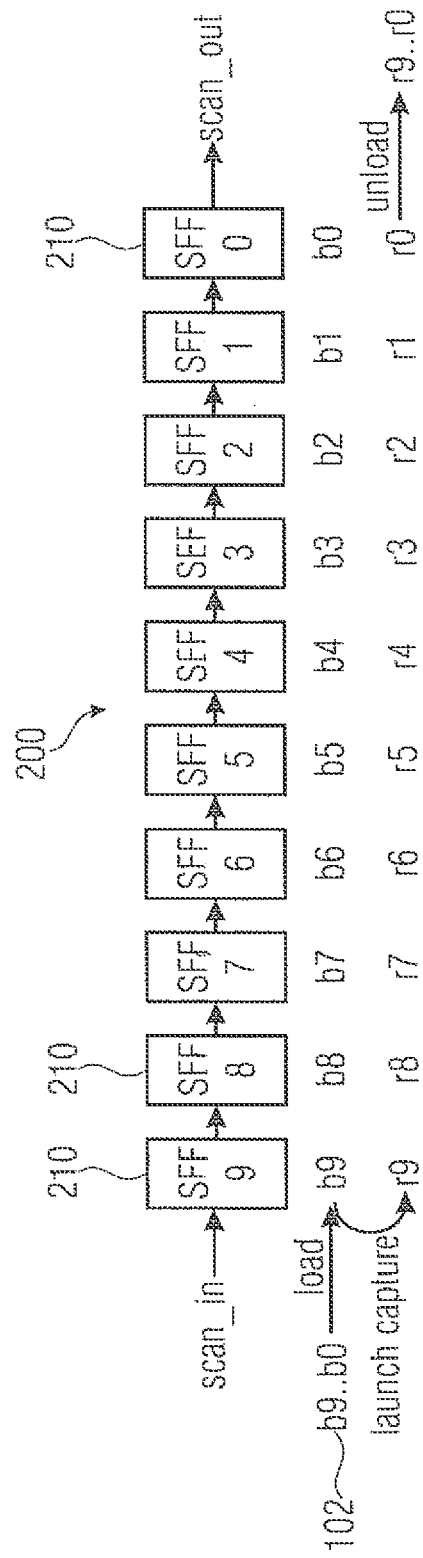
FIG. 2 is a schematic illustration of an exemplary scan chain test of a faultless scan chain.

For example, a good device with a scan chain length of 10 scan cells and scan input bits b0 . . . b9 (scan chain test input bit sequences) and scan output (response) bits r0 . . . r9 (scan chain test output bit sequences), as shown in FIG. 2, is considered.

Figure 3:
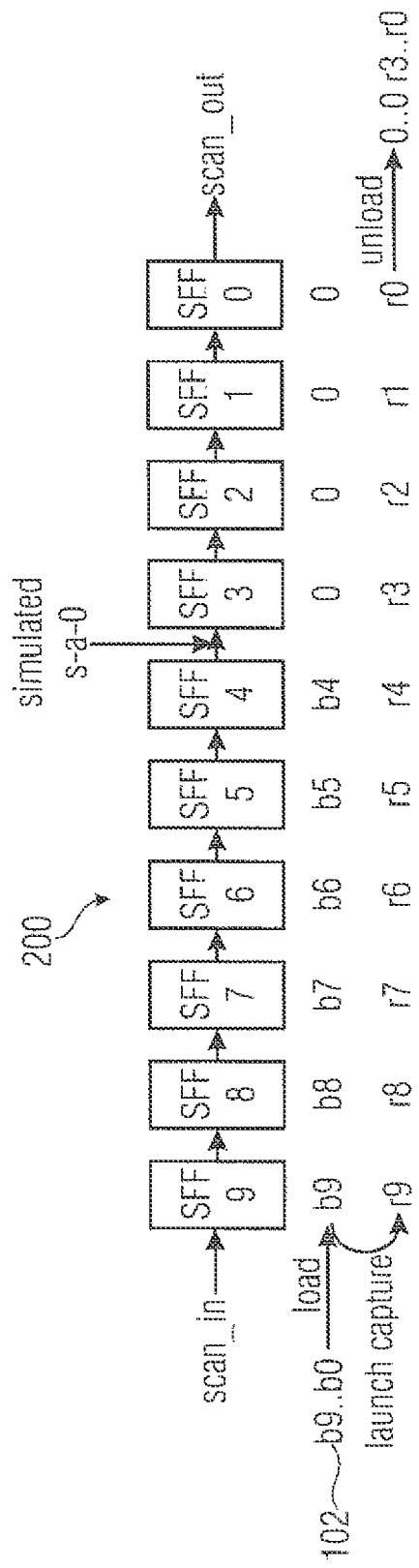
FIG. 3 is a schematic illustration of an exemplary scan chain test of a faulty scan chain comprising a stuck-at-0 failure between scan flip-flop 3 and scan flip-flop 4.

If there is a blocked scan chain then this can be modeled as a stuck-at fault in the scan chain. For example, if there is a stuck-at-0 fault between SFF3 (scan flip-flop 3) 210 and SFF4 (scan flip-flop 4) 210, then the defect modifies scan input values stored in the scan cells and scan output values observed on a test apparatus as shown in FIG. 3.

Figure 4:
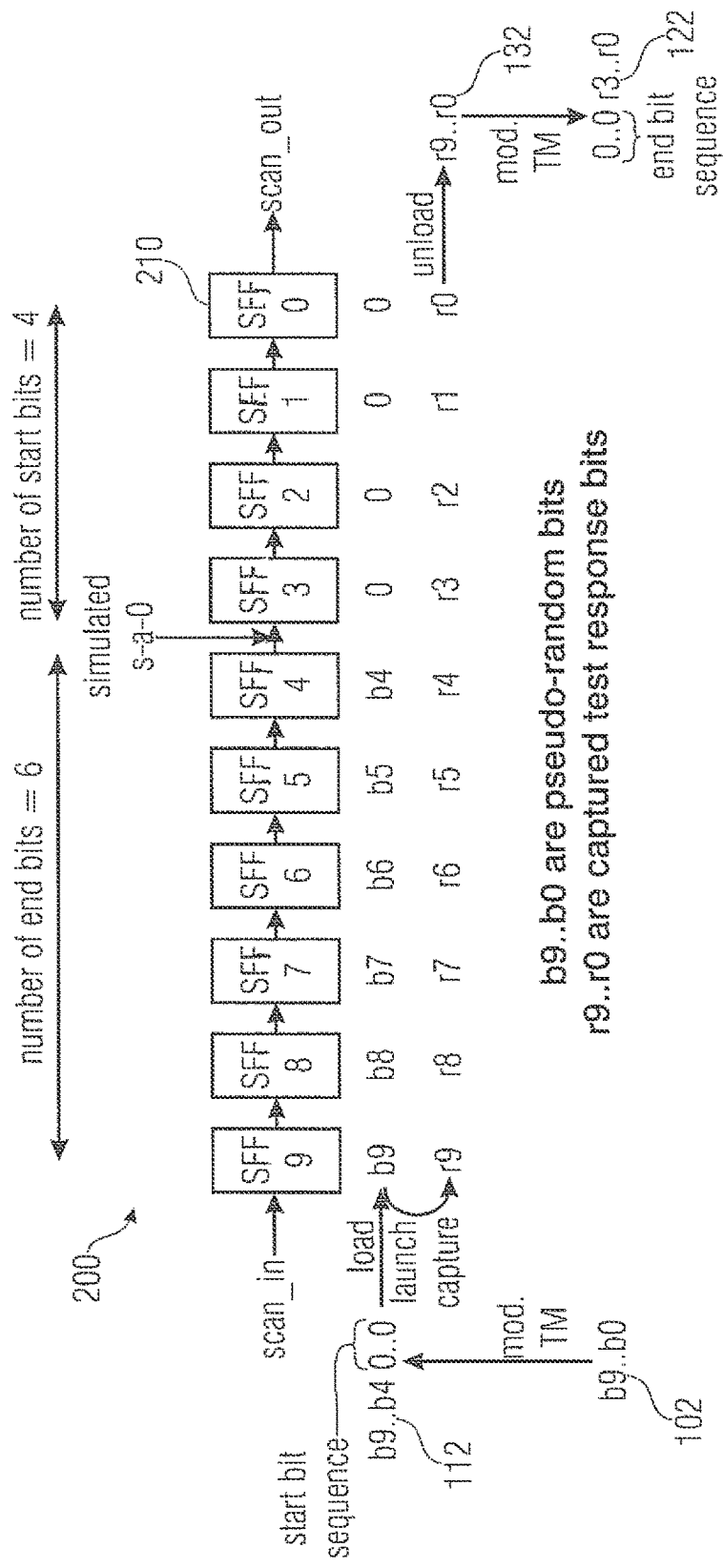
FIG. 4 is a schematic illustration of a an exemplary scan chain test of a faultless device reproducing a stuck-at-0 failure between scan flip-flop 3 and scan flip-flop 4.

The result 0 . . . 0 r3 . . . r0 can be reproduced with a good device, if the test apparatus is capable of modifying scan input data 102 and output data 132 as shown in FIG. 4 (see "mod. TM", modified test model).

For an arbitrary number N (predefined number of start bits), the first N values shifted into an arbitrary scan chain are overwritten (replaced) by a pre-defined bit sequence (predefined start bit sequence), for example the first 4 values shifted into the scan chain 200 can be overwritten and set to a constant value "0". For an arbitrary number M (predefined number of end bits), the last M values shifted out of an arbitrary scan chain can be overwritten by a pre-defined bit sequence (predefined end bit sequence), for example the last 6 values shifted out of the scan chain can be overwritten and set to a constant value "0".

Figure 5:
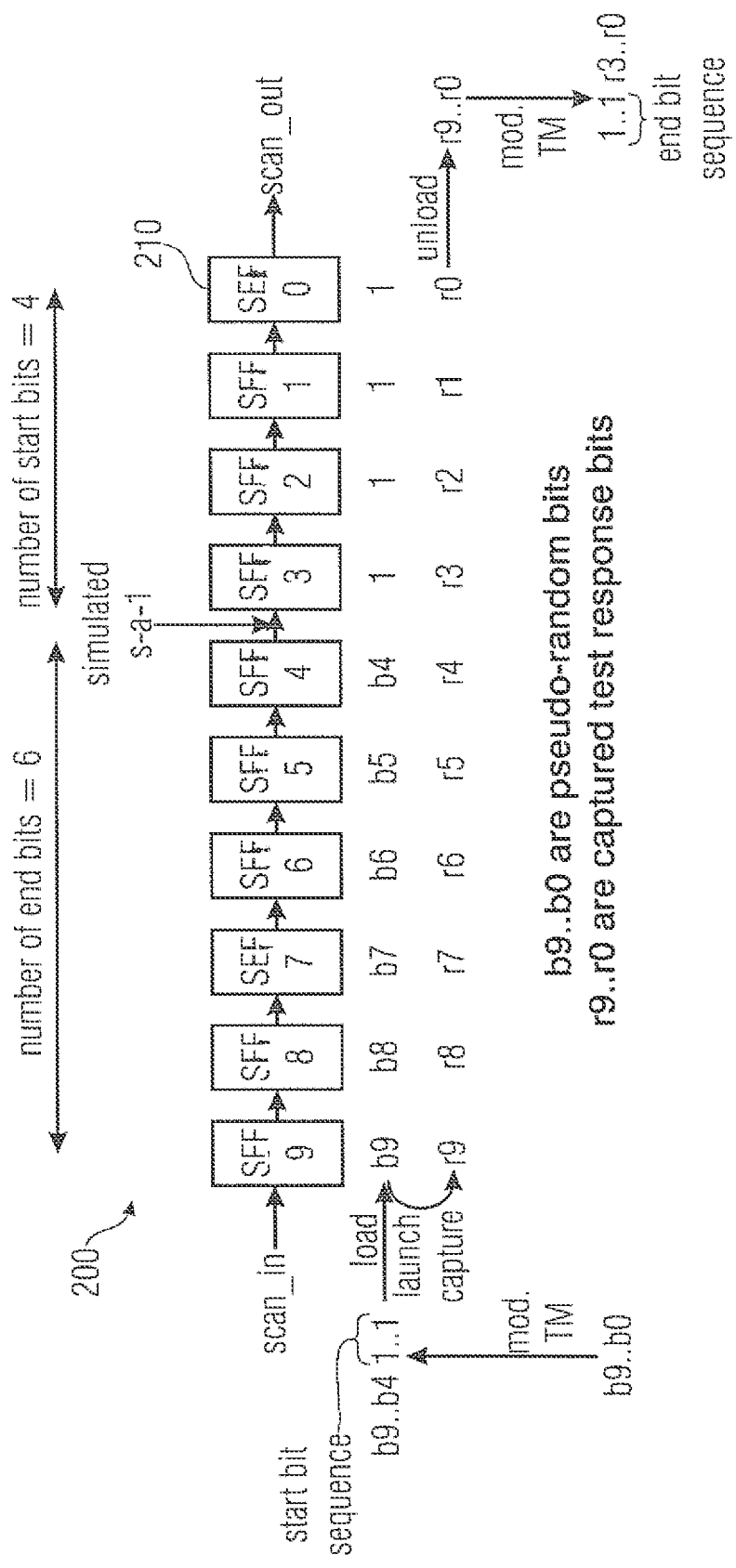
FIG. 5 is a schematic illustration of an exemplary scan chain test of a faultless device reproducing a stuck-at-1 failure between scan flip-flop 3 and scan flip-flop 4.

In a similar way the results of a scan chain blockage that can be modeled as a stuck-at-1 fault between SFF3 and SFF4, can be reproduced on the suitable test apparatus as shown in FIG. 5.

Figure 6A:
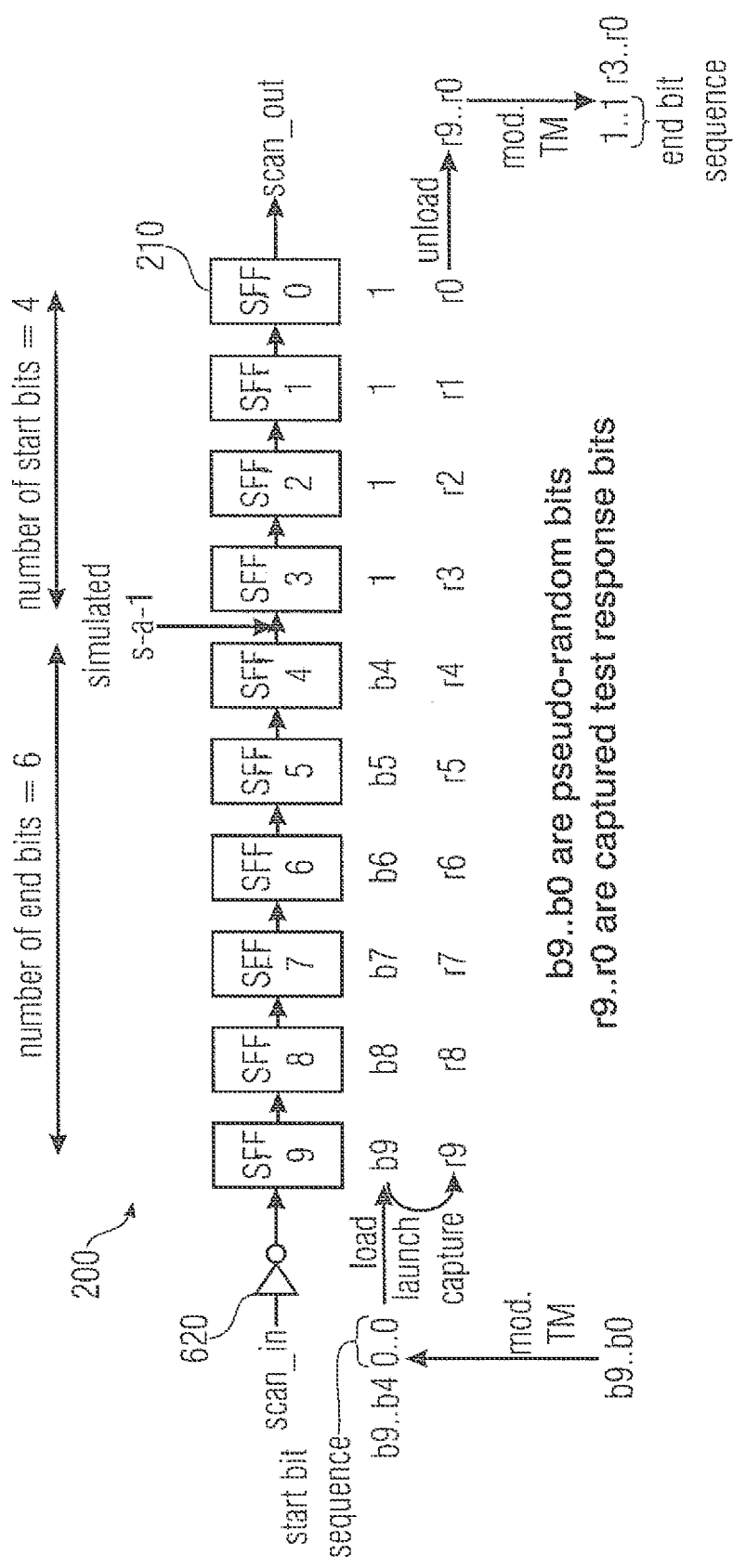
FIG. 6a shows a schematic illustration of an exemplary scan chain test of a faultless scan chain comprising an odd number of inverters reproducing a stuck-at-1 failure between scan flip-flop 3 and scan flip-flop 4.

Even if there is an odd number of inverters 620 along the path from the scan input to the blocked site, this can be reproduced on the suitable test apparatus, as shown in FIG. 6a.

If there is an odd number of inverters along the path from the blocked site to the scan output or an odd number of inverters along both paths, i.e., scan input to faulty site and faulty site to scan output, then these scenarios can be reproduced similarly.

Figure 6B:
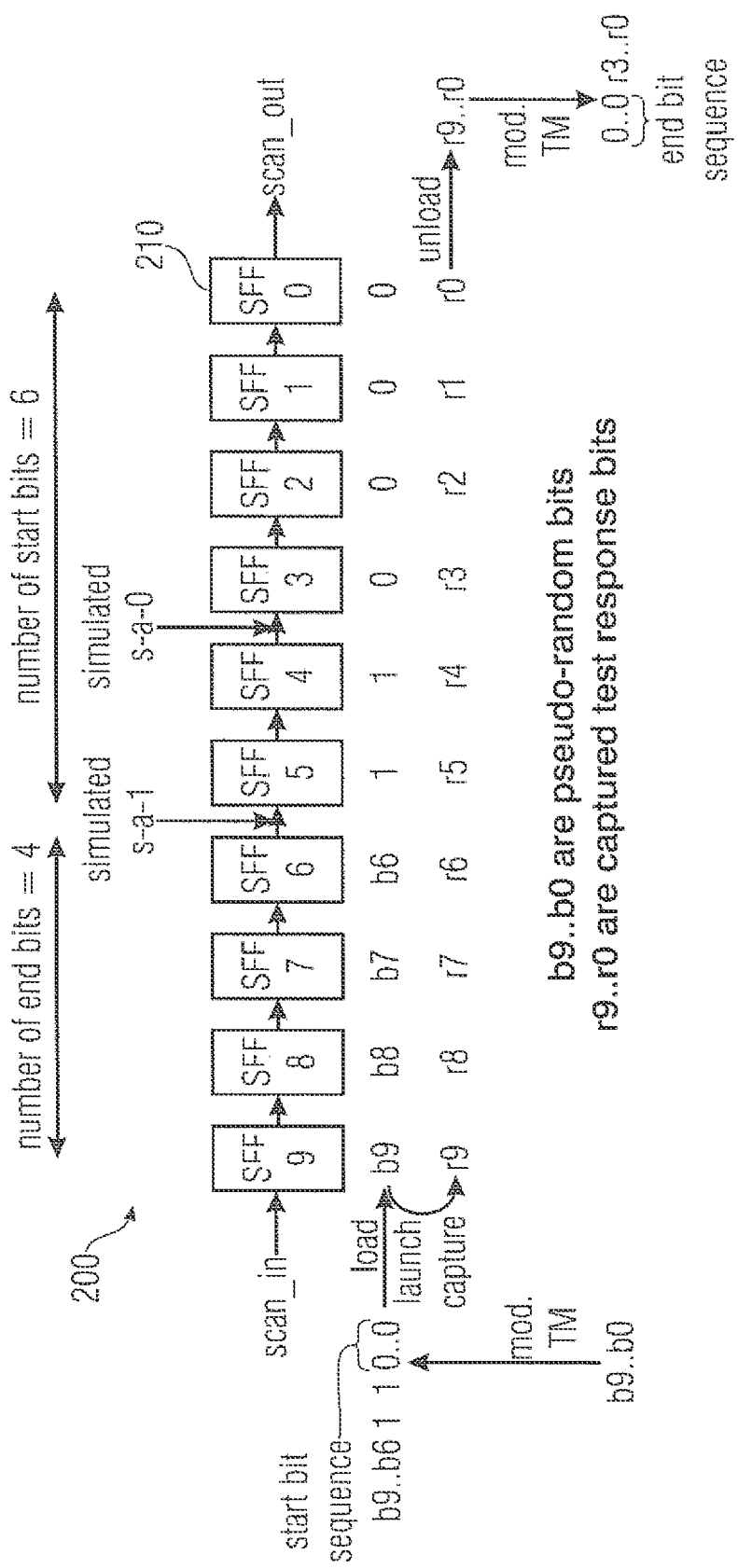
FIG. 6b shows a schematic illustration of an exemplary scan chain test of a faultless scan chain reproducing a stuck-at-0 failure between scan flip-flop 3 and scan flip-flop 4 and a stuck-at-1 failure between scan flip-flop 3 and scan flip-flop 4.

Further, a scan chain may comprise more than one failure position. For example, FIG. 6b shows a scan chain with two stuck-at-failures. In this case, the start bit sequence may contain 0s and 1s.

The observations above are true for both types of blockage, stuck-at-0 and stuck-at-1.

The observations are not specifically related to a scan chain of 10 scan cells, and the size of the scan chain can be arbitrary.

The observations are not specifically related to the position of the blocked site (e.g. as shown above between SFF3 and SFF4). The position can be anywhere in the scan chain. In other words, a failure between two arbitrary neighboring scan cells of the scan chain or a failure within a scan cell itself may be reproduced. A failure within a scan cell itself may be treated similarly with a failure between the faulty scan cell and the following scan cell of the scan chain.

The observations are shown for a single scan chain, but is also valid, if more (good) scan chains are in the device. Reference scan chain data may be generated for one, some or all scan chains of a faultless device under test.

The modification of input patterns as shown above might bring the DUT into an unknown state, which can be tolerated by the DUT in accordance with the present disclosure.

Thus, reference scan chain test data 122 can be obtained from a faultless device under test. This reference scan chain test data 122 may be compared with scan chain test data obtained from a faulty device. For this, the test apparatus 100 may provide the scan chain test input bit sequence 102 (without modification) to a faulty device under test comprising a faulty scan chain and may obtain a faulty scan chain test output bit sequence from the faulty device under test. This scan chain test output bit sequence or information determined from the scan chain test output bit sequence (e.g. frequency of logic 0's or logic 1's) may be compared with the reference scan chain test data 122 obtained from the faultless device under test.

Figure 7:
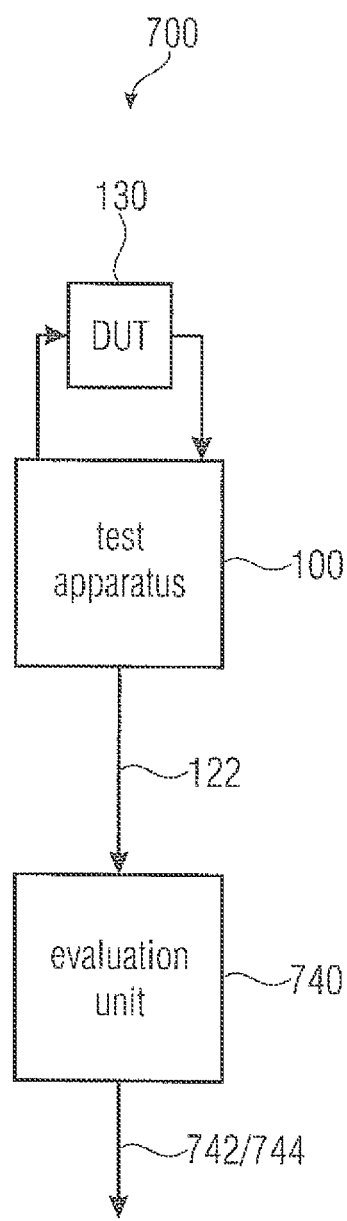
FIG. 7 is a block diagram of an exemplary test system.

FIG. 7 shows a block diagram of an exemplary test system 700 according to an embodiment of the invention. The test system 700 comprises a test apparatus 100 according to the mechanism described before and an evaluation unit 740. The evaluation unit 740 can compare information of a faulty scan chain test output bit sequence obtained from a faulty device under test comprising a faulty scan chain with the reference scan chain test data 122 to determine an information of a failure position 742 and a failure type 744 of the faulty scan chain.

The evaluation unit 740 may be connected to the test apparatus 100 as shown in FIG. 7 or may be independent from the test apparatus 100. An independent evaluation unit 740 may receive the reference scan chain test data 122 and/or the information of the faulty scan chain test output bit sequence from a storage device. In this way, a real time failure analysis, monitoring of manufacturing or volume testing may be possible.

The reference scan chain test data 122 may be, for example, the modified scan chain test output bit sequence itself, a frequency of occurring logic 1's or logic 0's of each bit position of the scan chain test output bit sequence 132 or a last toggled bit position indicating a position of the last bit within the scan chain test output bit sequence, a logic 1 as well as a logic 0 is obtained for different scan chain test output bit sequences. In other words, one could compare each single test response bit of the faulty DUT (for multiple patterns) with each single test response bit of the faultfree DUT for multiple fault types and multiple fault positions. This would end up in a huge amount of data, therefore using the bit frequencies or toggle bit positions may be of advantage.

Correspondingly, the information of the faulty scan chain test output bit sequence obtained from the faulty device under test may be the faulty scan chain test output bit sequence itself, a frequency of occurring logic 1's or logic 0's for each bit position of the scan chain test output bit sequence 132 or a last toggle bit position of the faulty scan chain test output bit sequence.

The information of the failure position 742 and the failure type 744 of the faulty scan chain may be the exact failure position (e.g. scan cell or between two scan cells) and the failure type (stuck-at-0 or stuck-at-1), if the comparison provides an unambiguous result. For transient blocked scan chains, the result of the comparison may be ambiguous. In this case, the evaluation unit 740 may determine a failure candidate list containing possible failure positions and failure types together with a corresponding confidence level information (e.g. probability of indicating the actual failure position and/or failure type of the faulty scan chain) representing the determined information of the failure position 742 and the failure type 744 of the faulty scan chain.

Often test patterns comprise a plurality of different scan chain test input bit sequences (e.g. pseudo random bit sequences or a predefined sequence of different scan chain test input bit sequences). In this case, the test pattern generator 110 may modify the plurality of different scan chain test input bit sequences 102 by replacing the same predefined number of start bits of each scan chain test input bit sequence 102 of the plurality of scan chain test input bit sequences with the same predefined start bit sequence. Further, the output data modifier 120 may modify a plurality of scan chain test output bit sequences 132 caused by the plurality of modified scan chain test input bit sequences 112 by replacing the same predefined number of end bits of each scan chain test output bit sequence 132 of the plurality of scan chain test output bit sequences 132 with the same predefined end bit sequence. Based on this plurality of modified scan chain test output bit sequences the output data modifier 120 may obtain the reference scan chain test data. In other words, the test apparatus 100 may determine for each scan chain test input bit sequence 102 a modified scan chain test output bit sequence.

The number of bits of each scan chain test input bit sequence of the plurality of input bit sequences and the number of bits of each scan chain test output bit sequence of the plurality of scan chain test output bit sequences may be the same and may be equal to the number of scan cells of the scan chain to be tested.

The obtained reference scan chain test data 122 may be the plurality of modified scan chain test output bit sequences or an information obtained from them.

For example, the test apparatus 100 or the evaluation unit 740 may comprise a frequency determiner 850. This frequency determiner 850 may determine a frequency 852 of occurring logic 1's or logic 0's for each bit position of the scan chain test output bit sequence based on the plurality of modified scan chain test output bit sequences. In other words, the frequency determiner 850 may determine a ratio 852 of occurring logic 1's and occurring logic 0's for each scan cell of the scan chain to be tested. This may be done for the faultless device and the faulty device, so that the evaluation unit 740 can compare the frequency 852 of occurring logic 1's or logic 0's (or the ratio of logic 1's to logic 0's) of the good device and the faulty device to obtain the information of the failure position 742 and the failure type 744 of the faulty scan chain. Alternatively, instead of comparing frequencies of all bits of a scan chain only the bit number and frequencies of the biggest outliers (e.g. the biggest 16, 32, 64 or another number) or most characteristic bits (e.g. the 16, 32, 64 or another number of most characteristic bits) may be stored as failure characteristic and may be compared to the corresponding frequencies of the faulty device.

Determining the frequency of occurring logic 1's or logic 0's may be especially useful for determining failure positions and failure types of transient stuck at failures (transient blocked scan chains).

Alternatively, the test apparatus 100 or the evaluation unit 740 may comprise a toggle bit determiner 860. This toggle bit determiner 860 may determine a last toggle bit position 862 within a scan chain test output bit sequence. The last toggle bit position 862 may indicate a position of the last bit within the scan chain test output bit sequence outputted by the scan chain to be tested comprising for at least one scan chain test output bit sequence of the plurality of scan chain test output bit sequences a logic 0 and for at least one scan chain test output bit sequence of the plurality of scan chain test output bit sequences a logic 1. In this way, the last faultless scan cell before the failure position may be determined. In this connection, the last toggle bit position 862 may be counted starting from the output of the scan chain. In the examples shown in FIGS. 2 to 6 the last toggle bit position 862 would be a scan cell with the highest number (SFF 0 to SFF 9) before the failure position (e.g. SFF3 in FIG. 3). This kind of reference scan chain test data 122 may be especially useful for permanent stuck at failures (permanent blocked scan chains). Alternatively, instead of the last toggle bit position, a first stuck-at bit position 864 may be determined. The first stuck-at bit position 864 may indicate a position of the first bit within the scan chain test output bit sequence outputted by the scan chain to be tested comprising for all scan chain test output bit sequences of the plurality of scan chain test output bit sequences a logic 0 or for all scan chain test output bit sequences of the plurality of scan chain test output bit sequences a logic 1.

Figure 8:
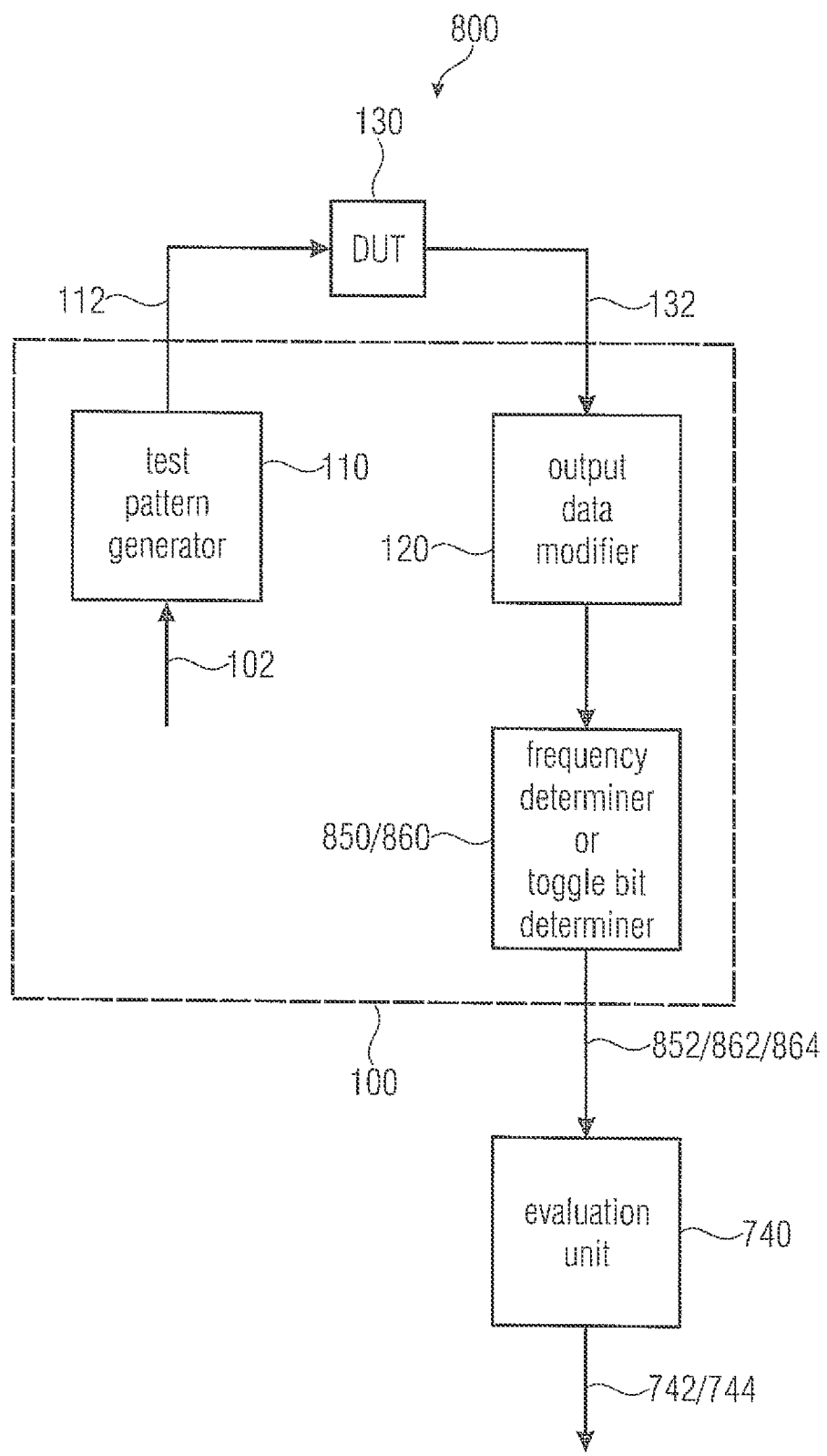
FIG. 8 is a block diagram of a further exemplary test system.

Fittingly, FIG. 8 shows a block diagram of an exemplary test system according to an embodiment of the invention. The test system 800 is similar to the test system shown in FIG. 7, but comprises additionally a frequency determiner 850 and/or a toggle bit determiner 860 as mentioned above, located between the output data modifier 120 of the test apparatus 100 and the evaluation unit 740.

The frequency determiner 850 and/or the toggle bit determiner 860 may be part of the test apparatus 100 or part of the evaluation unit 740. In the example shown in FIG. 8, the frequency determiner 850 and/or the toggle bit determiner 860 are part of the test apparatus 100 and provide a frequency 862 of occurring logic 1's or logic 0's, a last toggle bit position 862 or a first stuck-at bit position 864 as mentioned above.

The test system 100 may comprise both the frequency determiner 850 and the toggle bit determiner 860 or only one of them.

Since the failure position and failure type of a faulty scan chain may be unknown, it may be desired to generate reference scan chain test data 122 for a plurality of different possible failure positions and/or failure types or even for all possible failure positions and failure types. For this, the test pattern generator 110 may modify the same scan chain test input bit sequence 102 by replacing a plurality of different predefined numbers of start bits (e.g. depending on the failure position) with a plurality of different start bit sequences (e.g. depending on the failure type and/or the number of inverters within the scan chain) to obtain a plurality of modified scan chain test input bit sequences 112. Then, the output data modifier 120 may modify a plurality of scan chain test output bit sequences 132 caused by the plurality of modified scan chain test input bit sequences 112 by replacing a plurality of different predefined numbers of end bits (e.g. depending on the failure position) corresponding to the plurality of different numbers of start bits with a plurality of different end bit sequences (e.g. depending on the failure type and/or the number of inverters within the scan chain) to obtain a plurality of reference scan chain test data 122 representing different supposed failure positions or failure types of the scan chain.

In other words, the predefined numbers of start bits and predefined number of end bits as well as the predefined start bit sequence and the predefined end bit sequence may be varied to reproduce a failure at different failure positions and of the different failure types. The plurality of reference scan chain test data may be compared with the information of the faulty scan chain test output bit sequence obtained from a faulty device under test to determine the information of the failure position 742 and the failure type 744 of the faulty scan chain. In other words, the reference scan chain test data 122 matching (or matching best) the information of the faulty scan chain test output bit sequence may reveal the failure position and failure type of the faulty scan chain, since each reference scan chain test data 122 is generated for a specific failure position (e.g. considered by the predefined number of start bits and the predefined number of end bits) and a specific failure type (e.g. considered by the predefined start bit sequence and the predefined end bit sequence).

In some embodiments of the invention different failure positions and failure types as well as different scan chain test input bit sequences can be taken into consideration. In this case, the test apparatus may generate a plurality of reference scan chain test data for a plurality of different supposed failure positions, different failure types and different scan chain test input bit sequences. Based on this data, the evaluation unit may compare the faulty scan chain test output bit sequence (or a sequence of a plurality of faulty scan chain test output bit sequences corresponding to the plurality of different scan chain test input bit sequences) with each reference scan chain test data of the plurality of reference scan chain test data or may compare a frequency of occurring logic 1's or logic 0's of the plurality of faulty scan chain test output bit sequences determined for different scan chain test input bit sequences with a frequency of logic 1's or logic 0's of each reference scan chain test data of the plurality of reference scan chain test data, for example. In other words, the test apparatus may reproduce reference scan chain test data for different supposed failure positions, different failure types and different scan chain test input bit sequences, which may be compared with the corresponding output of the faulty device to determine an information of a failure position and a failure type of the faulty scan chain of the faulty device under test.

Sometimes failures within scan chains exist not permanently. Such failures may appear randomly or may be data depending, for example. For these transient failures, the failure position and failure type is difficult to determine. Using the described mechanism, such transient failures can also be identified and localized.

For this, the test pattern generator 110 may provide a plurality of unmodified, different scan chain test input bit sequences 102 subsequently to a faultless device under test and a faulty device under test. The term unmodified means in this case, that the predefined number of start bits is not replaced by the predefined start bit sequence. Then, the frequency determiner determines a frequency of occurring logic 1's or logic 0's for each bit position of the scan chain test output bit sequence for the faultless device under test and for the faulty device under test based on a plurality of unmodified scan chain test output bit sequences received from the faultless device under test and a plurality of unmodified scan chain test output bit sequences from the faulty device under test (caused by the plurality of unmodified, different scan chain test input bit sequences). Further, the evaluation unit may determine a difference between the frequency of logic 0's or logic 1's determined for the faulty device under test and the frequency of logic 0's or logic 1's determined for the faultless device under test for each position of the scan chain test output bit sequence to obtain a failure characteristic. This failure characteristic may indicate a failure position and or a failure type of the faulty device under test.

Optionally, the determined differences may be normalized (e.g. by dividing the differences by the number of unmodified, different scan chain test input bit sequences).

Additionally, the evaluation unit 740 may determine a difference between each frequency of logic 0's or logic 1's determined from a plurality of modified scan chain test output bit sequences obtained by considering a plurality of different supposed failure positions and different failure types and the frequency of logic 0's or logic 1's determined from the plurality of unmodified scan chain test output bit sequences of the faultless device under test to obtain a reference characteristic for each considered failure position and failure type. In other words, the evaluation unit may compare the faultless behavior of the faultless device under test by using unmodified scan chain test input bit sequences with the simulated faulty behavior of the faultless device under test by using modified scan chain test input bit sequences for different supposed failure positions and different failure types.

Optionally, the determined differences may be normalized (e.g. by dividing the differences by the number of unmodified or modified, different scan chain test input bit sequences).

Further, the evaluation unit 740 may compare the determined failure characteristic with each determined reference characteristic to obtain the information of the failure position and the failure type.

Figure 9:
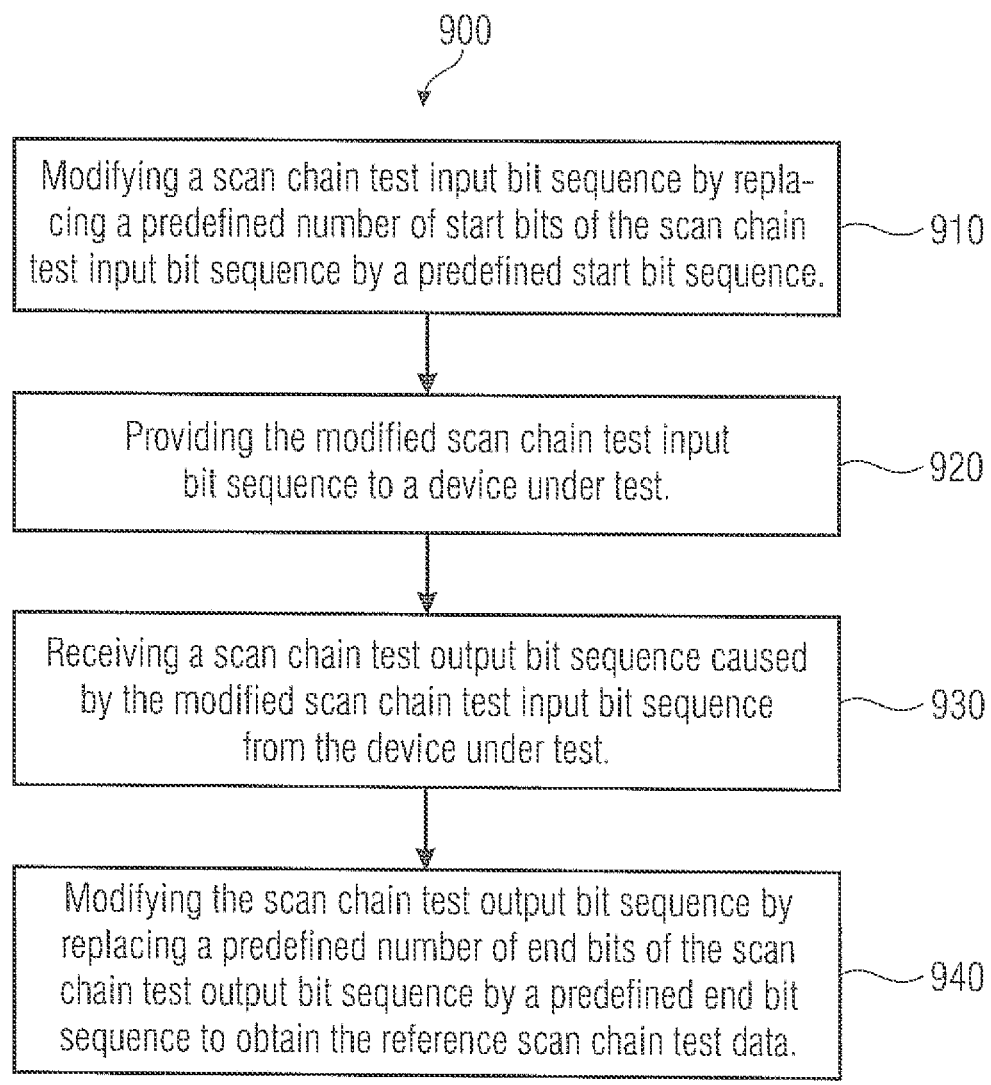
FIG. 9 is a flowchart of an exemplary method for generating reference scan chain test data.

FIG. 9 shows a flowchart of a method 900 for generating reference scan chain test data according to an embodiment of the invention. The method 900 comprises modifying 910 a scan chain test input bit sequence by replacing a predefined number of start bits of the scan chain test input bit sequence with a predefined start bit sequence. Then, the modified scan chain test input bit sequence is provided 920 to a device under test and a scan chain test output bit sequence caused by the modified scan chain test input bit sequence is received 930 from the device under test. Further, the method 900 comprises modifying 940 the scan chain test output bit sequence by replacing a predefined number of end bits of the scan chain test output bit sequence with a predefined end bit sequence to obtained the reference scan chain test data.

Optionally, a plurality of different scan chain test input bit sequences may be modified by replacing the same predefined number of start bits with the same predefined start bit sequence to consider a test pattern comprising several different scan chain test input bit sequences as for example pseudo random bit sequences. Accordingly, the plurality of scan chain test output bit sequences caused by the plurality of modified scan chain test input bit sequences may be modified by replacing the same predefined number of end bits with the same predefined end bit sequence.

Further optionally, different failure positions and/or failure types may be considered by replacing a plurality of different predefined numbers of start bits with a plurality of different predefined start bit sequences to obtain a plurality of modified scan chain test input bit sequences. Accordingly, the plurality of scan chain test output bit sequences caused by the plurality of modified scan chain test input bit sequences is modified by replacing a plurality of different predefined numbers of end bits corresponding to the plurality of different numbers of start bits with a plurality of different predefined end bit sequences. Optionally, a frequency of occurring logic 1's or logic 0's may be determined for each bit position of the scan chain test output bit sequence based on the plurality of modified scan chain test output bit sequences.

Figure 10:
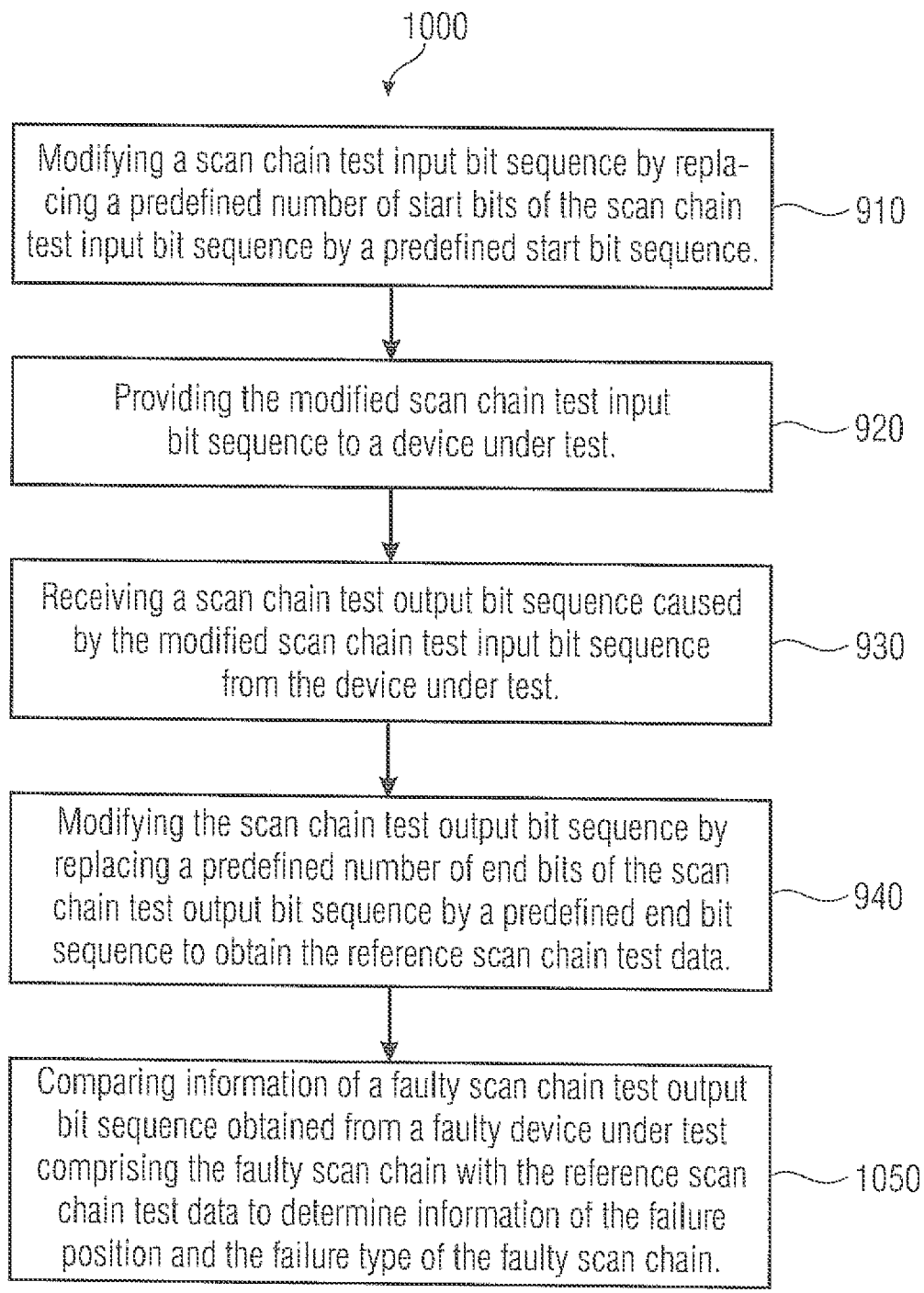
FIG. 10 is a flowchart of an exemplary method for determining an information of a failure position and a failure type of a faulty scan chain.

FIG. 10 shows a flowchart of a method 1000 for determining an information of a failure position and a failure type of a faulty scan chain according to an embodiment of the invention. The method 1000 is similar to the method shown in FIG. 9, but comprises additionally comparing 1050 information of a faulty scan chain test output bit sequence obtained from a faulty device under test comprising the faulty scan chain with the reference scan chain test data to determine information of a failure position and a failure type of the faulty scan chain.

For example, the observation mentioned above may be utilized for block chain analysis in six steps.

The first three steps may prepare blocked chain analysis using a good device in order to generate an intended data (reference scan chain test data):

1. Define an appropriate set of test patterns SP (this step is optionally, since scan patterns SP may be provided by a storage device).
2. Run the set SP (scan pattern, test pattern, plurality of scan chain test input bit sequences) on the specific test apparatus for a good device and store for each scan chain and for each bit of the scan chain (each bit of the scan chain test output bit sequence) the frequency of observed "1"s.
3. For each scan chain, for each possible fault location and for each inversion polarity (odd or even number of inverters) along the scan chain—assuming either stuck-at-0 or stuck-at-1—(i.e. for each possible fault candidate of a blocked chain, e.g. considered by the respective predefined start bit sequence and the predefined end bit sequence) re-produce the faulty scan results for SP on the specific test apparatus. Store for each bit of the scan chain, that contains the assumed blocking fault candidate, the frequency of observed "1"s.

The next steps may be executed once a DUT shows the behavior of a blocked scan chain and blocked chain analysis is required:

4. Run the set SP on the specific test apparatus for the faulty device and store for each bit of the faulty scan chain the frequency of observed "1"s.
5. Firstly a permanent blocked scan chain may be assumed. Compare for each bit of the faulty scan chain the frequencies obtained in step 4 with that obtained reproducing fault candidates' behavior in step 3. The lower the differences of the frequencies, the higher the confidence rating (confidence level). Finally, the output of this analysis step may be a list of fault candidates sorted according to the confidence rating.
6. If the results of step 5 give no clear indication then a transient defect may be assumed. Then compute the difference between the frequencies of a good device (step 2) and the faulty device (step 4) for all scan bits of the faulty scan chain and normalize over these differences. Analog compute for each fault candidate the normalized differences between the frequencies of a good device and the values obtained for reproducing faulty behavior in step 3 for the faulty scan chain. The lower the differences of the values of the faulty device and of a reproduced faulty behavior, the higher the confidence rating. Again, the output of this analysis step may be a list of fault candidates sorted according to the confidence rating.

With data of steps 1-3 prepared, step 4 can be performed on the specific test apparatus. Then the resulting data can be uploaded to a computer (evaluation unit) that afterwards executes steps 5 and 6. Thus, the expected run-time (test time) for steps 4-6, that have to be executed for each occurrence of a blocked chain, is only seconds and this analysis is applicable for high volume manufacturing.

Step 2 and step 3 might generate large amounts of data. The amount of data used for the blocked chain analysis can be reduced, if only that part of data is generated that is necessary for analyzing a certain blocked scan chain. Although the analysis may not be ideal during high volume manufacturing, it is still very valuable in less time critical steps, for example during bring-up of test and validation or characterization of the DUT.

For the modification the six steps given above may be reordered such that step 2 and step 3 are performed no earlier than a DUT showing the behavior of a blocked scan chain. Then only the faulty scan chain is considered, and in step 2 "1" frequencies for a good device can be determined only regarding this chain. In step 3 the behavior of fault candidates can be reproduced only regarding this chain as well. Step 2 and step 3 might be performed after step 4.

The method can be simplified, if only permanently blocked scan chains are considered. Then step 2 and 6 may be skipped. In step 3 and step 4 no longer bit frequencies of observed "1"s are stored, but a single number per chain may be sufficient. This number (last toggle bit position) may be the highest (counting from scan outputs as shown in the pictures above) bit, for that the specific test apparatus could observe "0" and "1" while applying patterns SP. Alternatively, also a first stuck-at bit position may be determined. During analysis in step 5, rating is computed by comparing the numbers. The expected run time (test time) for this simplification can be considerably smaller.

Some embodiments according to the invention relate to a blocked chain analysis providing confidence levels on results.

Blocked chain analysis often delivers ambiguous results. One goal is, beyond identifying possibly faulty sites, to provide a confidence level to the analysis results—for both, transient and permanent defects blocking scan chains. The analysis usually takes only seconds.

For the new blocked chain analysis it is assumed, that at least one device exists, for that a scan test can be set up such that shifting through scan chains is successful. Furthermore it is assumed, that filling scan chains with arbitrary values and running in normal operation mode does not produce new defects in the device.

The described mechanism utilizes a test apparatus capable of addressing both, transient and permanent defects blocking scan chains. For example, beside three steps being performed only once in order to prepare intended data (generate reference scan chain test data), the blocked chain analysis for a fault runs in seconds and may provide additionally a confidence level for the analysis results to address ambiguousness.

The specific test apparatus may provide a way to identify the structure of the scan pattern in order to distinguish shift and launch/capture cycles of a scan pattern. For this, the test pattern generator may be triggered by a trigger pin (similar to a clock signal) or a list of vector numbers stored by a storage device to identify the start of a scan chain test input bit sequence, wherein a vector represents for each pin of the test apparatus the current logic value (e.g. logic 1 or logic 0).

The specific test apparatus must be able to modify scan input data (scan chain test input bit sequence) such that for an arbitrary number N, the first N values shifted into an arbitrary scan chain are overwritten by a pre-defined bit sequence, for example constant values—"0" or "1".

The specific test apparatus must be able to modify scan output data (scan chain test output bit sequence) such that for an arbitrary number M, the last M values shifted out of an arbitrary scan chain are overwritten by a pre-defined bit sequence, for example constant values—"0" or "1".

Additionally, the specific test apparatus may be able to compute the "1" frequencies in step 2, 3 and 4.

For the simplified analysis (only permanently blocked scan chains are considered), the specific test apparatus may be able to determine the highest number of scan bits producing toggling output (last toggle bit position).

In some embodiments according to the invention, the test apparatus is an automatic test equipment.

An aspect of the present invention is a setup to reproduce faulty behavior with a good device. This includes a specific test apparatus that supports the full process or that only supports the simplified process according to requirements mentioned above, for example.

Another aspect of the invention is a method (process) as described above to compute blocked scan chain analysis results sorted regarding a confidence level, applicable to transient defects as well. Alternatively, a modified method (process) with reordered steps reducing amount of data to be stored may be used. Optionally, also the simplified process mentioned above may be used for reducing steps, amount of data to be stored and/or runtime (test time).

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

The invention claimed is:

1. A test system comprising:
a test pattern generator configured to: receive an input scan chain;
generate a modified input scan chain by replacing a first predefined number of start bits of the input scan chain with a predefined start bit sequence; and provide the modified input scan chain to a device under test (DUT); and
an output data modifier and configured to: receive an output scan chain that is generated by the DUT in response to the modified input scan chain; generate a modified output scan chain by replacing a second predefined number of end bits of the output scan chain with a predefined end bit sequence; and obtain first reference scan chain test data based on the modified output scan chain.

2. The testing system according to claim 1, wherein the first predefined number of start bits and the second predefined number of end bits are determined based on a supposed failure position within a scan chain circuit, and wherein the first reference scan chain test data comprises the modified output scan chain, a frequency of occurring logic 1s or logic 0s of each bit position of the output scan chain, and/or a last toggled bit position indicating a position of the last bit within the output scan chain.

3. The test system according to claim 1, wherein the first predefined number plus the second predefined number is equal to a number of bits of the input scan chain, and equal to a number of bits of the output scan chain.

4. The test system according to claim 1, wherein the predefined start bit sequence and the predefined end bit sequence are determined based on a supposed failure type that is associated with the first reference scan chain test data.

5. The test system according claim 1, wherein the predefined start bit sequence and the predefined end bit sequence comprises only logic 0s or only logic 1s.

6. The test system according to claim 1 wherein the output scan chain is generated by a faultless scan chain of the DUT in response to the modified input scan chain.

7. The test system according to claim 1, wherein the test pattern generator is further configured to: provide the input scan chain to a faulty BUT that comprises a faulty scan chain circuit; and wherein a faulty output scan chain is generated by the faulty scan chain in response to the input scan chain.

8. The test system according to claim 7 further comprising an evaluation unit configured to: compare information derived from the faulty output scan chain with the first reference scan chain test data; and determine a failure position and a failure type in the faulty scan chain circuit.

9. The test system according to claim 1,
wherein the test pattern generator is further configured to: receive a plurality of different input scan chains, replace the first predefined number of start bits with the predefined start bit sequence in each of the plurality of different input scan chains, and generate a plurality of modified input scan chains; and
wherein the output data modifier is further configured to: receive a plurality of output scan chains generated in response to the plurality of modified input scan chains; replace the second predefined number of end bits with the predefined end bit sequence in each of the plurality of output scan chains; generate a plurality of modified output scan chains; and obtain second reference scan chain test data based on the plurality of modified output scan chains.

10. The test system according to claim 9 further comprising a frequency determiner configured to determine a frequency of occurring logic is or logic 0s for each bit position of the plurality of output scan chains based on the plurality of modified output scan chains, wherein frequency of the occurring logic 1 s and logic 0s are incorporated in the second reference scan chain test data.

11. The test system according to claim 9 further comprising a toggle bit determiner configured to determine a last toggle bit position within an output scan chain of the plurality of output scan chains, and/or to determine a first stuck-at bit position of an output scan chain of the plurality of output scan chains.

12. The test system according to claim 10,
wherein the test pattern generator is further configured to provide a plurality of unmodified input scan chains to a faultless DUT and a faulty DUT;
wherein the frequency determiner is further configured to determine a frequency of occurring logic 1s or logic 0s for each bit position of an unmodified output scan chain for the faultless DUT and for the faulty DUT; and
wherein the evaluation unit is further configured to determine a difference between a frequency of occurring logic 0s or logic 1s determined for the faulty DUT and a frequency of occurring logic 0s or logic 1s determined for the faultless DUT for each position of the unmodified output scan chain, and obtain a failure characteristic accordingly.

13. The test system according to claim 10, wherein the evaluation unit is further configured to determine a difference between a frequency of occurring logic 0s or occurring logic 1s determined from a plurality of modified output scan chains and the frequency of logic 0s or logic 1s determined from the plurality of unmodified output scan chains of the faultless DUT for each bit position of the output scan chain to obtain a reference characteristic for each supposed failure position and failure type, wherein the plurality of modified output scan chains are generated by considering a plurality of different supposed failure positions and different failure types.

14. The test system according to claim 13, wherein the evaluation unit is further configured to compare a failure characteristic with a reference characteristic for each supposed failure position and failure type and determine the failure position and the failure type.

15. The test system according to claim 1,
wherein the test pattern generator is further configured to modify the input scan chain by replacing a plurality of different predefined numbers of start bits with a plurality of different predefined start bit sequences to generate a plurality of modified input scan chains; and
wherein the output data modifier is further configured to: receive a plurality of output scan chains generated in response to the plurality of modified input scan chains; replace a plurality of different predefined numbers of end bits with a plurality of different predefined end bit sequences; generate a plurality of modified output scan chains; and accordingly obtain a plurality of reference scan chain test data which are indicative of different supposed failure positions or failure types of a faulty scan chain.

16. The test system according to claim 15 further comprising: an evaluation unit configured to (1) compare information derived from a faulty output scan chain with each of the plurality of reference scan chain test data; and/or (2) compare a frequency of occurring logic 1s or logic 0s of a plurality of faulty output scan chains with a frequency of occurring logic 1s or logic 0s of the plurality of reference scan chain test data, wherein the a plurality of faulty output scan chains are generated in response to different input scan chains.

17. The test system according to claim 16, wherein the evaluation unit is further configured to determine a failure candidate list containing possible failure positions, failure types and corresponding confidence levels associated thereof.

18. A circuit for generating reference scan chain test data, the circuit comprising:
a test pattern generator configured to: receive an input scan chain; generate a modified scan chain test input bit by replacing a first predefined number of start bits of the input scan chain with a predefined start bit sequence; and provide the modified input scan chain to a device under test (DUT); and
an output data modifier coupled to the test pattern generator and configured to:
receive an output scan chain that is generated by the DUT in response to the modified input scan chain; generate a modified output scan chain by replacing a second predefined number of end bits of the output scan chain with a predefined end bit sequence; and obtain first reference scan chain test data based on the modified output scan chain.

19. A method of determining a failure position and failure type of a scan chain, the method comprising:

receiving a first input scan chain at a test pattern generator;

generating a first modified input scan chain at a test pattern generator by replacing a first predefined number of start bits of the first input scan chain with a predefined start bit sequence;

providing the first modified input scan chain from the test pattern generator to a device under test (DUT), wherein the DUT is configured to generate a first output scan chain in response, generating a first modified output scan chain at an output data modifier by replacing a second predefined number of end bits of first the output scan chain with a predefined end bit sequence; and obtaining first reference scan chain test data based on the first modified output scan chain at said output data modifier.

20. The method according to claim 19 further comprising, at said output data modifier;

modifying each of a plurality of different input scan chains by replacing the first predefined number of start bits with the predefined start bit sequence to obtain a plurality of modified different input scan chains;

modifying the first input scan chain by replacing a plurality of different predefined numbers of start bits with a plurality of different predefined start bit sequences to obtain a plurality of modified same scan chain test input bits sequences;

modifying a plurality of output scan chains caused by the plurality of modified, different input scan chains by replacing the second predefined number of end bits by the predefined end bit sequence to obtain first reference scan chain test data for a first supposed failure position and failure type of a scan chain; and modifying a plurality of scan chain test output bits sequences caused by the plurality of modified, same input scan chains by replacing a plurality of different predefined numbers of end bits corresponding to the plurality of different numbers of start bits with a plurality of different predefined end bit sequences to obtain a plurality of reference scan chain test data that represent a plurality of different supposed failure positions or failure types of the scan chain.

21. The method according to claim 19, comprising, at a frequency determiner, determining a frequency of occurring logic 1 s or logic 0s for each bit position of the first output scan chain based on the plurality of modified same output scan chains, wherein frequencies of occurring logic 1s or logic 0s represent the reference scan chain test data for the first supposed failure position and failure type.

* * * * *